United States Patent
Xu et al.

(10) Patent No.: US 11,895,888 B2
(45) Date of Patent: Feb. 6, 2024

(54) DISPLAY PANEL AND DISPLAY DEVICE

(71) Applicant: KunShan Go-Visionox Opto-Electronics Co., Ltd, Jiangsu (CN)

(72) Inventors: Ji Xu, Kunshan (CN); Miao Chang, Kunshan (CN); Xiujian Zhu, Kunshan (CN); Lu Zhang, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 438 days.

(21) Appl. No.: 17/389,335

(22) Filed: Jul. 30, 2021

(65) Prior Publication Data

US 2021/0359080 A1 Nov. 18, 2021

Related U.S. Application Data

(63) Continuation of application No. PCT/CN2020/085200, filed on Apr. 16, 2020.

(30) Foreign Application Priority Data

Jul. 31, 2019 (CN) .......................... 201921228699.1

(51) Int. Cl.
*H10K 59/131* (2023.01)
*H10K 59/65* (2023.01)
*H10K 59/121* (2023.01)

(52) U.S. Cl.
CPC ....... *H10K 59/1315* (2023.02); *H10K 59/121* (2023.02); *H10K 59/65* (2023.02)

(58) Field of Classification Search
CPC .. H10K 59/1315; H10K 59/121; H10K 59/65; H10K 59/131; H10K 59/1213; G09G 3/3208
See application file for complete search history.

(56) References Cited

U.S. PATENT DOCUMENTS

2019/0123066 A1 4/2019 Zhan et al.
2020/0006448 A1* 1/2020 Chen .................... H10K 59/122
(Continued)

FOREIGN PATENT DOCUMENTS

CN 107610635 A 1/2018
CN 109272873 A 1/2019
(Continued)

OTHER PUBLICATIONS

PCT International Search Report for PCT/CN2020/085200, dated Jul. 16, 2020, 12 pages.

*Primary Examiner* — Earl N Taylor
(74) *Attorney, Agent, or Firm* — Maier & Maier, PLLC

(57) ABSTRACT

A display panel and a display apparatus, the display panel including a first display area, a second display area, and a transition display area between the first display area and the second display area, the light transmittance of the second display area being greater than that of the first display area and the transition display area, the display panel including: first pixels in the first display area; seconds pixels in the second display area; third pixels in the transition display area; second pixel circuits in the transition display area and used for driving the second pixels to display; and third pixel circuits in the transition display area and used for driving the third pixels to display, a third pixel unit of the display panel including a third pixel circuit and two or more third pixels of the same colour electrically connected thereto.

20 Claims, 8 Drawing Sheets

(56) References Cited

U.S. PATENT DOCUMENTS

| | | | |
|---|---|---|---|
| 2021/0065625 A1* | 3/2021 | Wang ..................... | H10K 59/35 |
| 2021/0265430 A1* | 8/2021 | Chang .................. | H10K 59/353 |
| 2021/0280128 A1* | 9/2021 | Shen ..................... | G09G 3/3225 |
| 2021/0343222 A1* | 11/2021 | Hei ....................... | G09G 3/3233 |
| 2021/0359080 A1* | 11/2021 | Xu ....................... | H10K 59/121 |
| 2021/0408111 A1* | 12/2021 | Lou ........................ | H01L 33/62 |
| 2021/0408152 A1* | 12/2021 | Lou ..................... | H10K 59/121 |
| 2022/0069023 A1* | 3/2022 | Lou ..................... | H10K 59/353 |
| 2022/0157895 A1* | 5/2022 | Xu ....................... | H10K 59/179 |
| 2022/0158117 A1* | 5/2022 | Chang ................ | H10K 50/8428 |
| 2022/0165827 A1* | 5/2022 | Xu ..................... | H10K 59/1201 |
| 2022/0199710 A1* | 6/2022 | Xu ....................... | G06F 1/1637 |

FOREIGN PATENT DOCUMENTS

| | | | | |
|---|---|---|---|---|
| CN | 109801903 A | | 5/2019 | |
| CN | 110634445 A | * | 12/2019 | ........... G09G 3/3208 |
| CN | 110767720 A | | 2/2020 | |
| CN | 210120136 U | | 2/2020 | |

* cited by examiner

DISPLAY PANEL AND DISPLAY DEVICE

CROSS-REFERENCE OF RELATED APPLICATIONS

The present application is a continuation of International Application No. PCT/CN2020/085200, filed on Apr. 16, 2020, which claims priority to Chinese Patent Application No. 201921228699.1, filed on Jul. 31, 2019, both of which are hereby incorporated by reference in their entireties.

TECHNICAL FIELD

The present application relates to the displaying field, and more particularly to a display panel and a display device.

BACKGROUND

Organic Light Emitting Diode (OLED) display panel as a flat display panel is widely used in various electronic products such as mobile phones, TVs, personal digital assistants, digital cameras, notebook computers, desktop computers and other and has become the mainstream of display panels due to its advantages of high image quality, power saving, thin body and wide application range, etc.

In order to increase the display area in a limited space, higher requirements are put forward for the area ratio of display panels in electronic products. Taking a mobile phone as an example, in related technologies, by designing a predetermined area of the display panel as a transparent display area, components such as a camera can be arranged on the back of the transparent display area, thereby realizing the under-screen integration of the camera and other elements, and improving the screen ratio of the electronic products. However, if the pixel circuits corresponding to multiple pixels in the transparent display area are arranged in the transparent display area, the transmittance of the transparent display area will be affected.

SUMMARY

The present application provides a display panel and a display device, which realize a more reasonable driving configuration for a plurality of pixels in the light-transmissible area of the display panel.

In one aspect, embodiments of the present application provide a display panel, which includes a first display area, a second display area, and a transition display area between the first display area and the second display area. The light transmittance of the second display area is greater than the light transmittance of the first display area and the transition display area, the display panel includes: a plurality of first pixels located in the first display area; a plurality of second pixel located in the second display area; a plurality of third pixel located in the transition display area; a plurality of second pixel circuit located in the transition display area and used to drive the plurality of second pixel to display; and a plurality of third pixel circuit located in the transition display area and used to drive the plurality of third pixel to display, wherein the display panel further includes a third pixel unit including one of the plurality of third pixel circuits and two or more of the plurality of third pixels of the same color electrically connected to the one third pixel circuit.

According to embodiments of the present application, the display panel includes a first display area, a second display area, and a transition display area. The light transmittance of the second display area is greater than that of the first display area and the transition display area, thereby facilitating being configured as the integration area of the photosensitive component to realize the under-screen integration of the photosensitive component. The plurality of second pixel circuits for driving the plurality of second pixels in the second display area to display are located in the transition display area, thereby reducing the wiring structure in the second display area and improving the light transmittance of the second display area. The plurality of third pixel circuits for driving the plurality of third pixels in the transition display area to display is electrically connected to two or more of the plurality of third pixels of the same color, thereby saving the occupied area of the plurality of third pixel circuits in the transition display area, so that the arrangement of the plurality of second pixel circuits and the plurality of third pixel circuits in the transition display area is more reasonable to avoid layout conflict.

According to the foregoing embodiment mode of one aspect of the present application, two or more third pixels of the same color in the third pixel unit are electrically connected to the one third pixel circuit through a first connection component, wherein the first connection component electrically connects any at least two of the plurality of third pixels to the one third pixel circuits in a manner of equal resistance to reduce the voltage drop (IR-drop) phenomenon in the first connection component, thereby alleviating the problem of uneven display brightness of the plurality of third pixels in the transition display area.

According to any one of the foregoing embodiment modes of one aspect of the present application, the first connecting component electrically connects all of the plurality of third pixels to the one third pixel circuits.

According to any one of the foregoing embodiment modes of one aspect of the present application, the first connection component includes: a first lead connected to the one third pixel circuits, and includes at least one first node; and a first interconnection structure that interconnects two or more third pixels of the same color and is connected to the first node of the first lead.

According to any one of the foregoing embodiment modes of one aspect of the present application, the first lead and the first interconnection structure are respectively located on different layers in the thickness direction of the display panel, and the first node of the first lead is connected to the first interconnection structure through a first via hole.

According to any one of the foregoing embodiment modes of one aspect of the present application, each of the plurality of third pixels includes a first electrode, a light-emitting layer on the first electrode, and a second electrode on the light-emitting layer. The first interconnection structure interconnects the first electrodes of the two or more three pixels of the same color.

According to any one of the foregoing embodiment modes of one aspect of the present application, the first interconnection structure and the first electrode are provided in the same layer.

According to any one of the foregoing embodiment modes of one aspect of the present application, the two or more third pixels of the same color in the third pixel unit are arranged collinearly, and the first interconnection structure includes at least one first interconnection line, and every adjacent ones of the two or more third pixels of the same color are connected by one first interconnection line; the first node of the first lead is connected to a midpoint of the first interconnection line.

According to any one of the foregoing embodiment modes of one aspect of the present application, the third pixel unit comprise m third pixels of the same color, and the first interconnection structure includes m−1 first interconnection lines and the m−1 first interconnection lines are arranged collinearly, where m is an integer greater than or equal to 2; the number of first node of the first lead is greater than or equal to 1, and the first interconnection line connected to the first node separates uniformly the m third pixels arranged collinearly.

According to any one of the foregoing embodiment modes of one aspect of the present application, the third pixel unit comprises n third pixels of the same color, and the n third pixels are divided into at least one group, and each group of third pixels includes at least two third pixels of the n third pixels, where n is an integer greater than or equal to 2; the number of first node of the first lead is the same as the number of the group of third pixels, and each group of third pixels is connected to one first node; the first interconnection structure includes a plurality of first branch lines, one end of each of the plurality of first branch lines is connected to one of the at least two third pixels, and the other end is connected to the corresponding first node; wherein the line lengths of each of the plurality of first branch lines are the same.

According to any one of the foregoing embodiment modes of one aspect of the present application, the display panel has a second pixel unit, and the second pixel unit includes one of the plurality of second pixel circuits and two or more of the plurality of second pixels of the same color electrically connected to the one second pixel circuits.

According to any one of the foregoing embodiment modes of one aspect of the present application, the size of each of the plurality of second pixels is greater than or equal to the size of each of the plurality of first pixels, and/or the size of each of the plurality of third pixels is greater than or equal to the size of each of the plurality of first pixels.

According to any one of the foregoing embodiment modes of one aspect of the present application, the transition display area includes a first sub-area adjacent to the first display area, a second sub-area adjacent to the second display area, and a third sub-area located between the first sub-area and the second sub-area, wherein the plurality of third pixel circuits are located in the first sub-area; the plurality of second pixel circuits are located in the second sub-area.

According to any one of the foregoing embodiment modes of one aspect of the present application, in the second pixel unit, the two or more second pixels of the same color are electrically connected to the one second pixel circuit through a second connection component, wherein the second connection component electrically connects any at least two of the plurality of second pixels to the one second pixel circuits in a manner of equal resistance to reduce the voltage drop (IR-drop) phenomenon in the second connection component, thereby alleviating the problem of uneven display brightness of the plurality of second pixels in the second display area.

According to any one of the foregoing embodiment modes of one aspect of the present application, the second connection component includes: a second lead connected to the one second pixel circuit and including at least one second node; and a second interconnection structure that interconnects the two or more second pixels of the same color and is connected to the second node of the second lead.

According to any one of the foregoing embodiment modes of one aspect of the present application, the second lead and the second interconnection structure are respectively located on different layers in the thickness direction of the display panel, and the second node of the second lead is connected to the second interconnection structure through a second via hole.

According to any one of the foregoing embodiment modes of one aspect of the present application, two or more second pixels in the second pixel unit are arranged collinearly, and the second interconnection structure includes at least one second interconnection line, every adjacent ones of the two or more second pixels are connected by corresponding one second interconnection line; the second node of the second lead is connected to a midpoint of the second interconnection line.

According to any one of the foregoing embodiment modes of one aspect of the present application, the second pixel unit includes p second pixels of the same color, and the second interconnection structure includes p−1 second interconnection lines and the p−1 second interconnection lines are arranged collinearly, where p is an integer greater than or equal to 2; the number of second node of the second lead is greater than or equal to 1, and the second interconnection line connected to the second node separates uniformly the p second pixels arranged collinearly.

According to any one of the foregoing embodiment modes of one aspect of the present application, the second pixel unit includes q second pixels of the same color, the q second pixels are divided into at least one group, and each group of second pixels includes at least two second pixels of the q second pixels, where q is an integer greater than or equal to 2; the number of second node of the second lead is the same as the number of group of second pixels, and each group of second pixels is connected to corresponding one second node; the second interconnection structure includes a plurality of second branch lines. One end of each of the plurality of second branch lines is connected to one of the at least two second pixels, and the other end is connected to a corresponding second node; wherein the line lengths of each of the plurality of second branch lines are the same.

In the other aspect, embodiments of the present application provide a display device, which includes a display panel according to any one of the foregoing embodiment modes.

According to the embodiment of the present application, the display panel includes a first display area, a second display area, and a transition display area. The light transmittance of the second display area is greater than that of the first display area and the transition display area, thereby facilitating being configured as the integration area of the photosensitive component to realize the under-screen integration of the photosensitive component. The plurality of second pixel circuit for driving the plurality of second pixel in the second display area to display is located in the transition display area, thereby reducing the wiring structure in the second display area and improving the light transmittance of the second display area. The plurality of third pixel circuit for driving the plurality of third pixel in the transition display area to display is electrically connected to two or more of the plurality of third pixels of the same color, thereby saving the occupied area of the plurality of third pixel circuit in the transition display area, so that the arrangement of the plurality of second pixel circuit and the plurality of third pixel circuit in the transition display area is more reasonable to avoid layout conflict.

DETAILED DESCRIPTION

In order to make the object, technical solutions, and advantages of the present application clearer, the following further describes the present application in detail with reference to the accompanying drawings and specific embodiments. It should be understood that the specific embodiments described herein are only configured to explain the present application, and not configured to limit the present application. For those skilled in the art, this application can be implemented without some of these specific details.

It should be noted that in this text, relational terms such as first and second are only used to distinguish one entity or operation from another entity or operation, and do not necessarily require or imply there is any actual relationship or order between these entities or operations.

It should be understood that when describing the structure of a component, when a layer or an area is referred to as being "on" or "above" another layer or another area, it can mean directly on the other layer or area, or it also includes other layers or areas between it and another layer or another area. And, if the component is turned over, the layer or area will be "below" or "under" the other layer or area.

Embodiments of the present application provide a display panel, which may be an organic light emitting diode (OLED) display panel.

Figure 1:
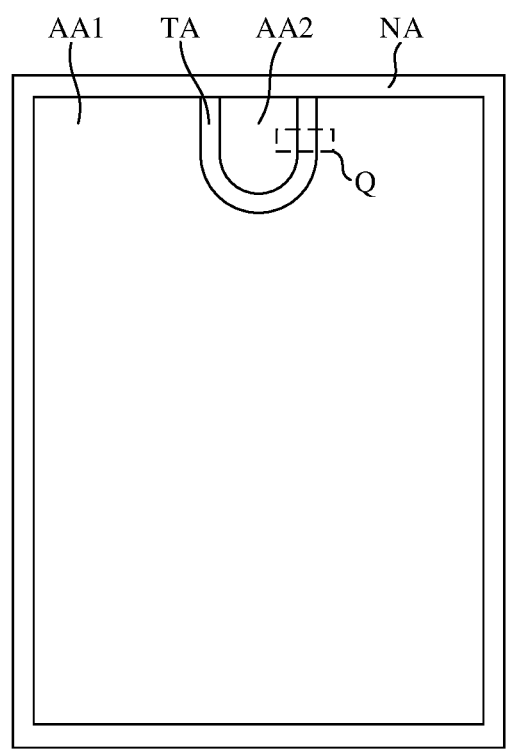
FIG. 1 is a schematic structural diagram of a display panel provided according to an embodiment of the present application.
Figure 2:
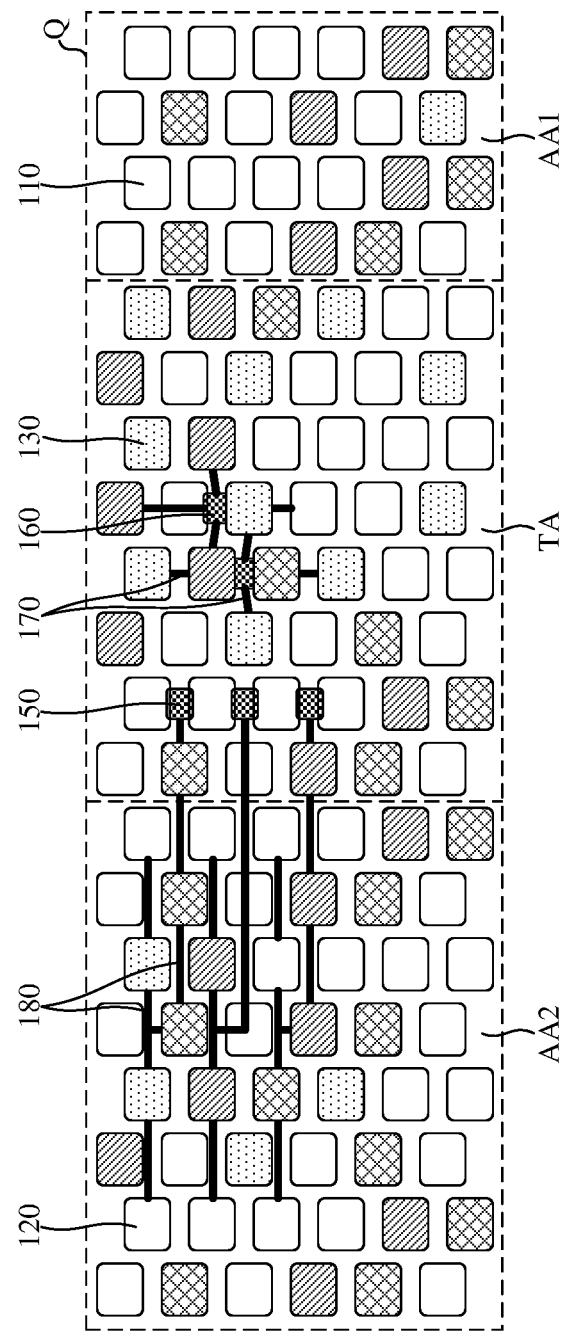
FIG. 2 is a partial enlarged view of an example of the Q area in FIG. 1.

FIG. 1 is a schematic structural diagram of a display panel provided according to an embodiment of the present application, and FIG. 2 is a partial enlarged view of an example of the Q area in FIG. 1.

The display panel 100 includes a first display area AA1, a second display area AA2, and a transitional display area TA located between the first display area AA1 and the second display area AA2. In some embodiments, the display panel 100 further includes a non-display area NA around the first display area AA1, the second display area AA2 and the transition display area TA. The light transmittance of the second display area AA2 is greater than the light transmittance of the first display area AA1 and the transition display area TA.

The display panel 100 includes a plurality of first pixels 110, a plurality of second pixels 120, a plurality of third pixels 130, a plurality of first pixel circuits (not shown), a plurality of second pixel circuits 150, and a plurality of third pixel circuits 160. The plurality of first pixels 110 are located in the first display area AA1, the plurality of second pixels 120 are located in the second display area AA2, and the plurality of third pixel 130 are located in the transition display area TA.

The plurality of first pixel circuits may be located in the first display area AA1 for driving the plurality of first pixels to display. In some embodiments, each of the plurality of first pixel circuits is electrically connected to corresponding one first pixel 110 to form a first pixel unit.

The plurality of second pixel circuits 150 are located in the transition display area TA and are used to drive the plurality of second pixels 120 to display.

The plurality of third pixel circuits 160 are located in the transition display area TA and are used to drive the plurality of third pixels 130 to display.

The display panel 100 of the present embodiment has a third pixel unit DU3. The third pixel unit DU3 includes one third pixel circuit 160 and two or more third pixels 130 of the same color electrically connected to the third pixel circuit 160.

The display panel 100 according to of the embodiment of the present application includes a first display area AA1, a second display area AA2, and a transition display area TA. The light transmittance of the second display area AA2 is greater than that of the first display area AA1 and the transition display area TA, which facilitates being configured as the integration area of the photosensitive component to realize the under-screen integration of the photosensitive component.

The plurality of second pixel circuits 150 for driving the plurality of second pixels 120 of the second display area AA2 to display is located in the transition display area TA, thereby reducing the wiring structure in the second display area AA2 and improving the light transmittance of the second display area AA2. The plurality of third pixel circuits 160 for driving the plurality of third pixels 130 of the transition display area TA to display is electrically connected to two or more third pixels 130 of the same color, thereby saving the occupied area of the plurality of third pixel circuits 160 in the transition display area TA, so that the arrangement of the plurality of second pixel circuits 150 and the plurality of third pixel circuits 160 in the transition display area TA is more reasonable to avoid layout conflict, and thus the transition display area TA can obtain a sufficient position for arranging the plurality of second pixel circuits 150.

The plurality of third pixels 130 may include red pixels, blue pixels, and green pixels, wherein two or more third pixels 130 electrically connected to the same and one third pixel circuit 160 in each third pixel unit DU3 are pixels of the same color.

In some embodiments, the size of each of the plurality of second pixels 120 is greater than or equal to the size of each of the plurality of first pixels 110, and/or the size of each of the plurality of third pixels 130 is greater than or equal to the size of each of the plurality of first pixels 110. The size of each of the plurality of third pixels 130 can be configured to be the same as that of each of the plurality of second pixels 120, so that when the transition display area TA and the second display area AA2 perform monochrome display, the fineness of the two tends to be the same, and the display difference between the transition display area TA and the second display area AA2 is reduced. In some other embodiments, the size of each of the plurality of third pixels 130 can also be configured to be the same as that of each of the plurality of first pixels 110, so that when the transition display area TA and the first display area AA1 perform monochrome display, the fineness of the two tends to be the same and the display difference between the transition display area TA and the first display area AA1 is reduced.

In this text, the size of a component refers to the size of the area occupied by all the structures included (or designed) by each component on the display surface of the display panel.

Figure 3:
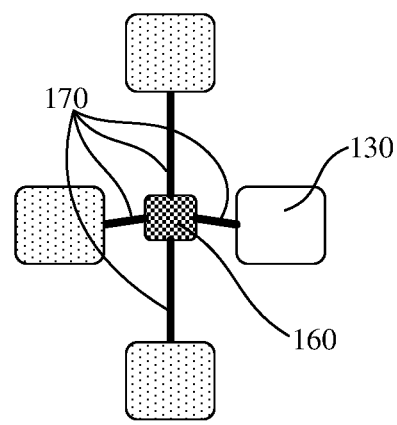
FIG. 3 is a schematic top view of the structure of a third pixel unit of the first example in the display panel provided according to an embodiment of the present application.

FIG. 3 is a schematic top view of the structure of a third pixel unit of the first example in the display panel provided according to an embodiment of the present application. In some embodiments, two or more third pixels 130 of the same color in the third pixel unit DU3 are electrically connected to one third pixel circuits 160 through a first connection component 170, wherein the first connection component 170 electrically connects any at least two third pixels 130 to the third pixel circuit 160 in a manner of equal resistance.

In the third pixel unit DU3 in the embodiment shown in FIG. 3, the third pixel circuit 160 is located at the physical center of the pattern surrounded by two or more third pixels 130 of the same color, so that the distance between at least two third pixels 130 and the third pixel circuit 160 is the same. When the connection structure between each of the plurality of third pixel 130 and the third pixel circuit 160 adopts the same configuration, the resistance between each of at least two third pixels 130 and the third pixel circuit 160 can be the same.

In the display panel 100 according to the above-mentioned embodiment, the first connection component 170 electrically connects any at least two third pixels 130 to the third pixel circuit 160 in a manner of equal resistance to reduce the voltage drop (IR-drop) phenomenon in the first connection component 170, thereby alleviating the problem of uneven display brightness of the plurality of third pixels 130 in the transition display area TA.

In some embodiments, at least part of the material of the first connecting component 170 includes at least one of indium tin oxide (ITO), indium zinc oxide, silver-doped indium tin oxide, or silver-doped indium zinc oxide.

Figure 4:
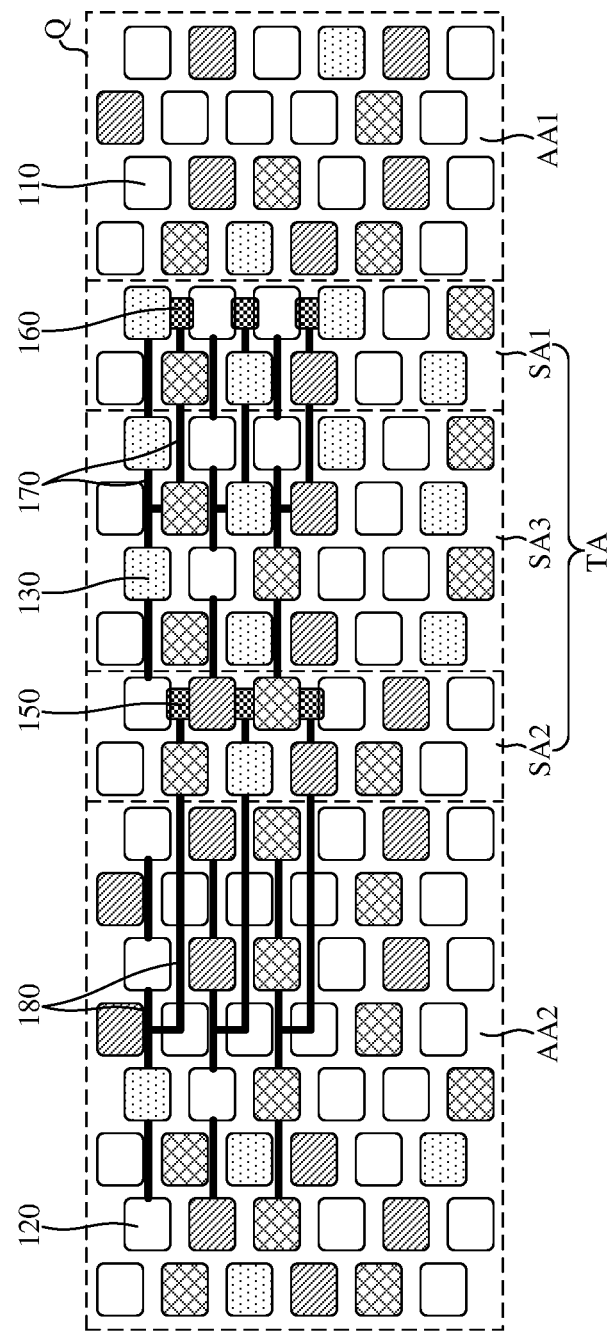
FIG. 4 is a partial enlarged view of another example of the Q area in FIG. 1 in which the connection manner between the third pixel circuit and the third pixel is different from that in FIG. 2.
Figure 5:
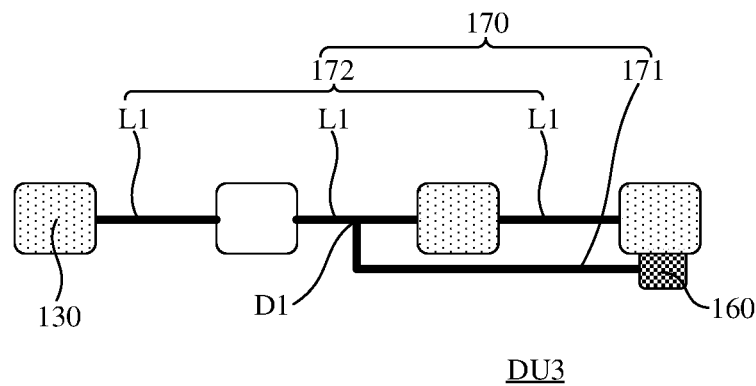
FIG. 5 is a schematic top view of the structure of a third pixel unit of a second example in a display panel according to an embodiment of the present application in which four third pixels are arranged collinearly and are connected to one third pixel circuit.
Figure 6:
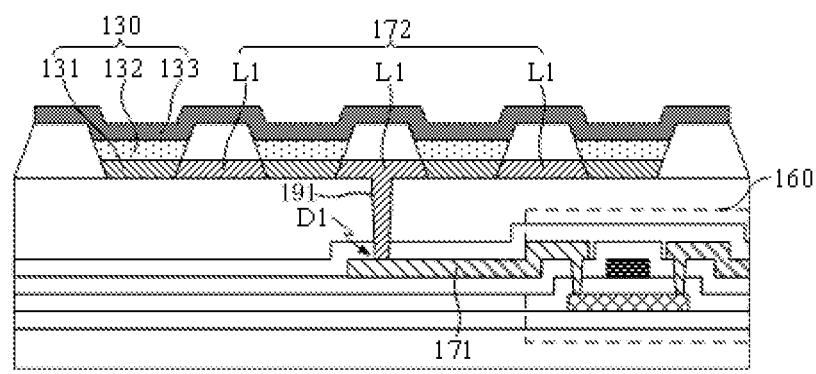
FIG. 6 is a schematic diagram of a layer structure of a third pixel unit of a second example in a display panel provided according to an embodiment of the present application.

FIG. 4 is a partial enlarged view of another example of the Q area in FIG. 1, in which the third pixel unit DU3 is not limited to the example of the foregoing embodiments and the connection manner between the third pixel circuit and the third pixel is different from that in FIG. 2. FIG. 5 is a schematic top view of the structure of the third pixel unit of the second example in the display panel provided according to an embodiment of the present application in which four third pixels are arranged collinearly and are connected to one third pixel circuit, and FIG. 6 is a schematic view of the layer structure of the third pixel unit of the second example.

In the present embodiment, two or more third pixels 130 of the same color in the third pixel unit DU3 are electrically connected to the third pixel circuit 160 through the first connection component 170, wherein the first connection component 170 electrically connects any at least two of third pixels 130 to the third pixel circuit 160 in a manner of equal resistance.

Specifically, the first connection component 170 includes a first lead 171 and a first interconnection structure 172. The first lead 171 is connected to the third pixel circuit 160 and includes at least one first node D1. The first interconnection structure 172 interconnects two or more third pixels 130 of the same color, and is connected to the first node D1 of the first lead 171.

In some embodiments, the first lead 171 and the first interconnection structure 172 are respectively located in different layers in the thickness direction of the display panel 100, and the first node D1 of the first lead 171 is connected to the first interconnection structure 172 through a first via hole 191.

The first interconnection structure 172 may be made of a light-transmitting conductive material such as ITO, and the first lead 171 may be made of a metal material or a light-transmitting conductive material such as ITO.

In some embodiments, each of the plurality of third pixels 130 includes a first electrode 131, a light-emitting layer 132 on the first electrode 131, and a second electrode 133 on the light-emitting layer 132. The first interconnection structure 172 interconnects the first electrodes 131 of the two or more third pixels 130 of the same color. In some embodiments, the first interconnection structure 172 may be provided in the same layer as the first electrode 131.

In the present embodiment, two or more third pixels 130 of the same color in the third pixel unit DU3 are arranged collinearly. The first interconnection structure 172 includes at least one first interconnection line L1, and every adjacent third pixels 130 of the same color are connected by one first interconnection line L1. The first node D1 of the first lead 171 is connected to a midpoint of the first interconnection line L1.

In some embodiments, the third pixel unit DU3 includes m third pixels 130 of the same color, the first interconnection structure 172 includes m−1 first interconnection lines L1, and m−1 first interconnection lines L1 are arranged collinearly, where m is an integer greater than or equal to 2. The number of the first node D1 of the first lead 171 is greater than or equal to one, and the first interconnection line L1 connected to the first node D1 separates the collinear m third pixels 130 uniformly.

In the present embodiment, four third pixels 130 of the same color in the third pixel unit DU3 is taken as an example for description. The adjacent third pixels 130 are connected by the first interconnection line L1, so that the third pixel unit DU3 includes three first interconnection lines L1. The three first interconnection lines L1 are arranged collinearly. In the present embodiment, one first node D1 of the first lead 171 is provided, which is connected to the first interconnection line L1 on the physical center of the four third pixels 130 that are arranged collinearly. With the first node D1 as a center, the four third pixels 130 is divided into two pairs symmetrically about the center, and the resistances of the third pixels 130 of each pair to the third pixel circuit 160 are equal.

Figure 7:
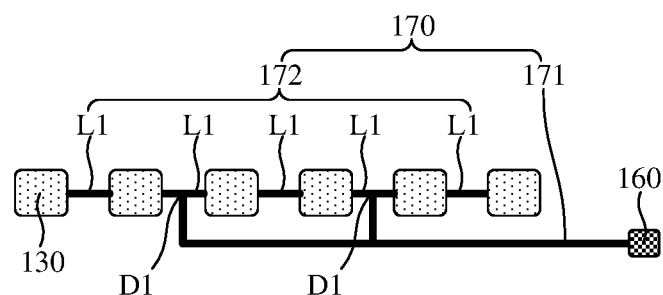
FIG. 7 is a schematic top view of the structure of a third pixel unit of a third example in a display panel provided according to an embodiment of the present application in which six third pixels are arranged collinearly and are connected to one third pixel circuit.

In the foregoing embodiment, one first node D1 of the first lead 171 is taken as an example for description. In other embodiments, the number of the first node D1 of the first lead 171 may be other number. FIG. 7 is a schematic top view of the structure of a third pixel unit in a third example in a display panel provided according to an embodiment of the present application.

In the present embodiment, two or more third pixels 130 of the same color in the third pixel unit DU3 are arranged collinearly. The first interconnection structure 172 includes at least one first interconnection line L1, and every adjacent third pixels 130 of the same color are connected by one first interconnection line L1. The first node D1 of the first lead 171 is connected to a midpoint of the first interconnection line L1.

In the present embodiment, six third pixels 130 of the same color in the third pixel unit DU3 are provided, and the first interconnection structure 172 includes five first interconnection lines L1, and the five first interconnection lines L1 are arranged collinearly. The number of the first node D1 of the first lead 171 is two, and the corresponding two first interconnecting lines L1 connected to the above two first nodes D1 separate the six collinear third pixels 130 uniformly, so that among the six third pixels 130 of the same color in the third pixel unit DU3, the resistances of at least part of the third pixels 130 to the third pixel circuit 160 tend to be equal.

In some embodiments, the first connection component 170 electrically connects all of the plurality of third pixels 130 to the third pixel circuit 160 in a manner of equal resistance.

Figure 8:
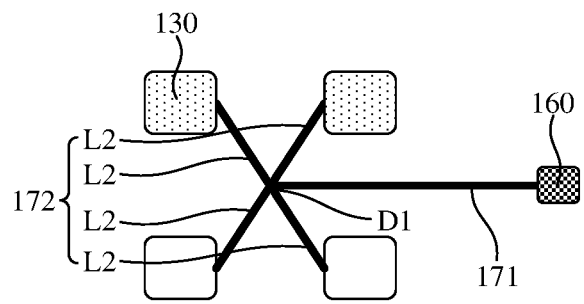
FIG. 8 is a schematic top view of the structure of a third pixel unit of a fourth example in a display panel provided according to an embodiment of the present application in which four third pixels are divided into one group and are connected to one third pixel circuit.
Figure 9:
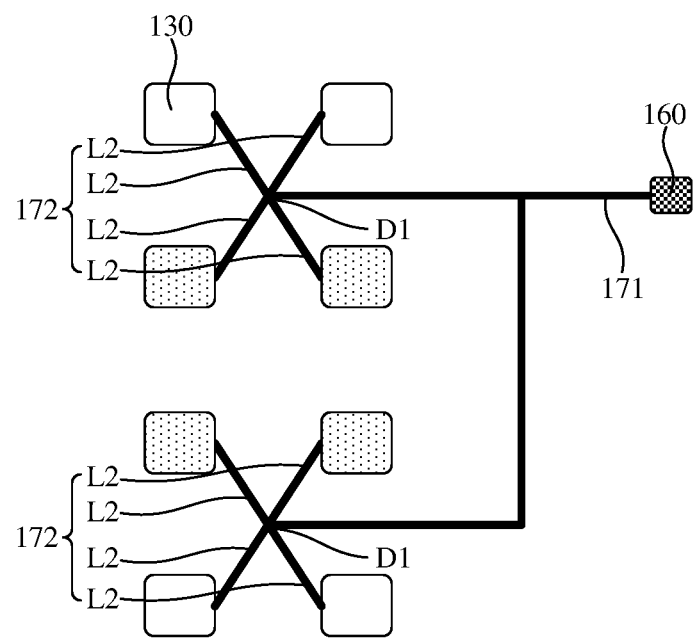
FIG. 9 is a schematic top view of the structure of a third pixel unit of a fifth example in a display panel provided according to an embodiment of the present application in which eight third pixels are divided into two group and two groups are connected to one third pixel circuit.

FIG. 8 and FIG. 9 are respectively a schematic top view of the structure of the third pixel unit of the fourth example in which four third pixels are divided into one group and are connected to one third pixel circuit and the third pixel unit of the fifth example in which eight third pixels are divided into two group and two groups are connected to one third pixel circuit in the display panel provided according to an embodiment of the present application.

In the present embodiment, the third pixel unit DU3 includes n third pixels 130 of the same color, the n third pixels 130 are divided into at least one group, and each group of third pixels 130 includes at least two third pixels 130, where n is an integer greater than or equal to 2.

In the embodiment shown in FIG. 8, the third pixel unit DU3 includes four third pixels 130 of the same color, and the four third pixels 130 are divided into one group. In the embodiment shown in FIG. 9, the third pixel unit DU3 includes eight third pixels 130 of the same color, and the eight third pixels 130 are divided into two groups, and each group includes four third pixels 130.

The number of the first node D1 of the first lead 171 is the same as the number of group of third pixels 130, and each group of third pixels 130 is connected to one first node DE The first interconnection structure 172 includes a plurality of first branch lines L2, one end of each of the plurality of first branch lines L2 is connected to one third pixel 130, and the other end is connected to the corresponding first node DE In the embodiment shown in FIG. 8, the third pixels 130 are respectively connected to the same and one first node D1 through the corresponding first branch line L2. In the embodiment shown in FIG. 9, the number of first node D1 is two, and each group of third pixels 130 is connected to one first node D1. In each group, the four third pixels 130 are respectively connected to the same and one first node D1 through the corresponding first branch line L2.

In some embodiments, the line lengths of each of the plurality of first branch lines L2 are equal, so that the resistance of respective third pixel 130 in the third pixel unit DU3 to the third pixel circuit 160 tends to be equal, thereby further alleviating the problem of uneven display brightness.

As shown in FIG. 2 or FIG. 4, in some embodiments, the display panel 100 further has a second pixel unit DU2. The second pixel unit DU2 includes one second pixel circuit 150 and two or more second pixels 120 of the same color electrically connected to the second pixel circuit.

As shown in FIG. 4, in some embodiments, the transition display area TA includes a first sub-area SA1 adjacent to the first display area AA1, a second sub-area SA2 adjacent to the second display area AA2, and a third sub-area SA3 between the first sub-area SA1 and the second sub-area SA2. The plurality of third pixel circuits 160 are located in the first sub-area SAE The plurality of second pixel circuits 150 are located in the second sub-area SA2, so that the third pixel circuits 160 and the second pixel circuits 150 are far away from each other to avoid wiring and signal interference between the two.

In the second pixel unit DU2, two or more second pixels 120 of the same color are electrically connected to one second pixel circuit 150 through a second connection component 180, wherein the second connection component 180 electrically connects any at least two second pixels 120 to the second pixel circuit 150 in a manner of equal resistance to reduce the voltage drop phenomenon in the second connection component 180, thereby alleviating the problem of uneven display brightness of the second pixels 120 in the second display area AA2.

The plurality of second pixels 120 may include red pixels, blue pixels, and green pixels, wherein two or more second pixels 120 electrically connected to the same and one second pixel circuit 150 in each third pixel unit DU3 are pixels of the same color.

In some embodiments, the configuration of the second connection component 180 in the second pixel unit DU2 may be similar to that of the first connection component 170 in the third pixel unit DU3. Some examples of the second pixel unit DU2 will be described below.

Figure 10:
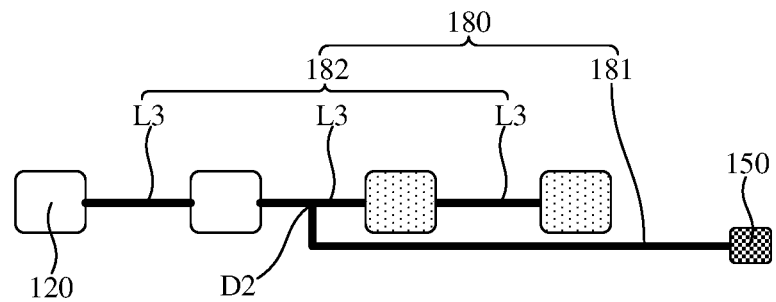
FIG. 10 is a schematic top view of the structure of a second pixel unit of the first example in the display panel provided according to an embodiment of the present application in which four second pixels are arranged collinearly and connected to one second pixel circuit.
Figure 11:
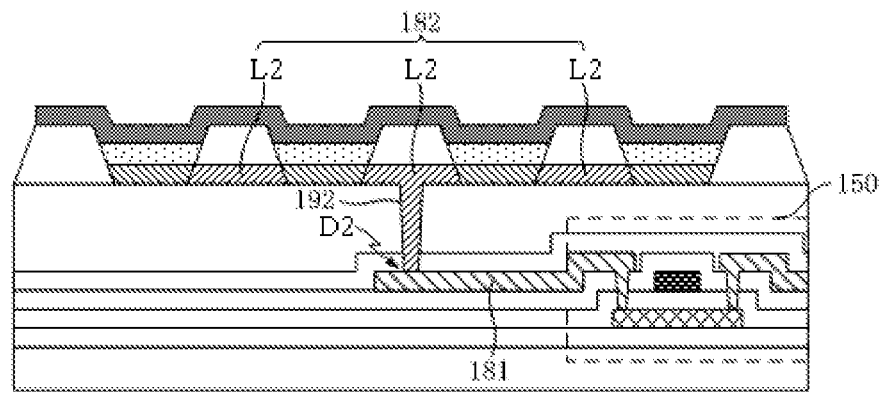
FIG. 11 is a schematic diagram of a layer structure of a second pixel unit of a first example in a display panel provided according to an embodiment of the present application.

FIG. 10 is a schematic top view of the structure of the second pixel unit of the first example in the display panel provided according to an embodiment of the present application in which four second pixels are arranged collinearly and connected to one second pixel circuit. FIG. 11 is a schematic view of the layer structure of the second pixel unit of the first example. In the present embodiment, two or more second pixels 120 of the same color in the second pixel unit DU2 are electrically connected to one second pixel circuit 150 through the second connection component 180.

Specifically, the second connection assembly 180 includes a second lead 181 and a second interconnection structure 182. The second lead 181 is connected to the second pixel circuit 150 and includes at least one second node D2. The second interconnection structure 182 interconnects two or more second pixels 120 of the same color, and is connected to the second node D2 of the second lead 181.

In some embodiments, the second lead 181 and the second interconnection structure 182 are respectively located at different layers in the thickness direction of the display panel 100, and the second node D2 of the second lead 181 is connected to the second interconnection structure 182 through a second via hole 192. The second interconnection structure 182 may be made of a light-transmitting conductive material such as ITO, and the second lead 181 may be made of a metal material or a light-transmitting conductive material such as ITO.

In the present embodiment, two or more second pixels 120 of the same color in the second pixel unit DU2 are arranged collinearly. The second interconnection structure 182 includes at least one second interconnection line L3, and every adjacent second pixels 120 of the same color are connected by one second interconnection line L3. The second node D2 of the second lead 181 is connected to a midpoint of the second interconnection line L3.

In some embodiments, the second pixel unit DU2 includes p second pixels 120 of the same color, the second interconnection structure 182 includes p−1 second interconnection lines L3, and p−1 second interconnection lines L3 are arranged collinearly, where p is an integer greater than or equal to 2. The number of the second node D2 of the second lead 181 is greater than or equal to one, and the second interconnection line L3 connected to the second node D2 separates uniformly the p second pixels 120 that are arranged collinearly.

In the present embodiment, four second pixels 120 of the same color in the second pixel unit DU2 are taken as an example for description. The adjacent second pixels 120 are connected by the second interconnection line L3, so that the second pixel unit DU2 includes three second interconnection lines L3. The three second interconnection lines L3 are arranged collinearly. In the present embodiment, one second node D2 of the second lead 181 is provided, which is connected to the second interconnection line L3 on the physical center of the four second pixels 120 that are arranged collinearly. The four second pixels 120 are divided into two pairs that are symmetrically arranged with the second node D2 as a center, and the resistance from the second pixel 120 of each pair to the second pixel circuit 150 are equal.

Figure 12:
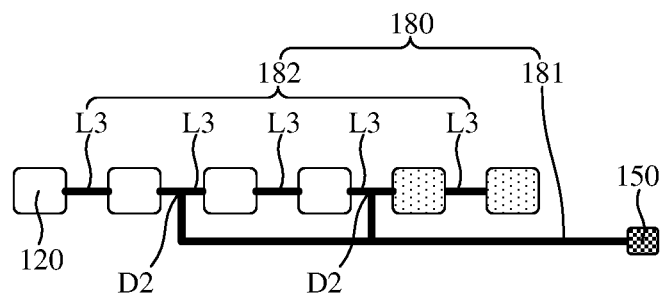
FIG. 12 is a schematic top view of the structure of a second pixel unit of a second example in a display panel provided according to an embodiment of the present application in which six second pixels are arranged collinearly and are connected to one second pixel circuit.

FIG. 12 is a schematic top view of the structure of a second pixel unit of a second example in a display panel provided according to an embodiment of the present application in which six second pixels are arranged collinearly and are connected to one second pixel circuit.

In the present embodiment, two or more second pixels 120 of the same color in the second pixel unit DU2 are arranged collinearly. The second interconnection structure 182 includes at least one second interconnection line L3, and every adjacent second pixels 120 of the same color is connected by one second interconnection line L3. The second node D2 of the second lead 181 is connected to a midpoint of the second interconnection line L3.

In the present embodiment, the second pixel unit DU2 includes six second pixels 120 of the same color, and the second interconnection structure 182 includes five second interconnection line L3, and the five second interconnection line L3 are arranged collinearly. The number of the second node D2 of the second lead 181 is two, and the corresponding two second interconnecting lines L3 connected to the above two second nodes D2 separate the six collinear second pixels 120 uniformly, so that in the six second pixels 120 of the same color in the second pixel unit DU2, the resistances of at least part of the second pixels 120 to the second pixel circuit 150 tend to be equal.

In some embodiments, the second connection component 180 electrically connects all of the second pixels 120 to the second pixel circuit 150 in a manner of equal resistance.

Figure 13:
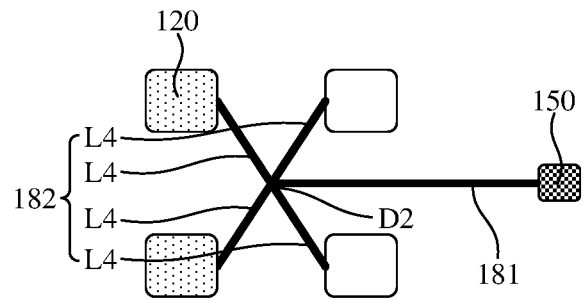
FIG. 13 is a schematic top view of the structure of a second pixel unit of a third example in a display panel provided according to an embodiment of the present application in which four second pixels are divided into one group and are connected to one second pixel circuit.
Figure 14:
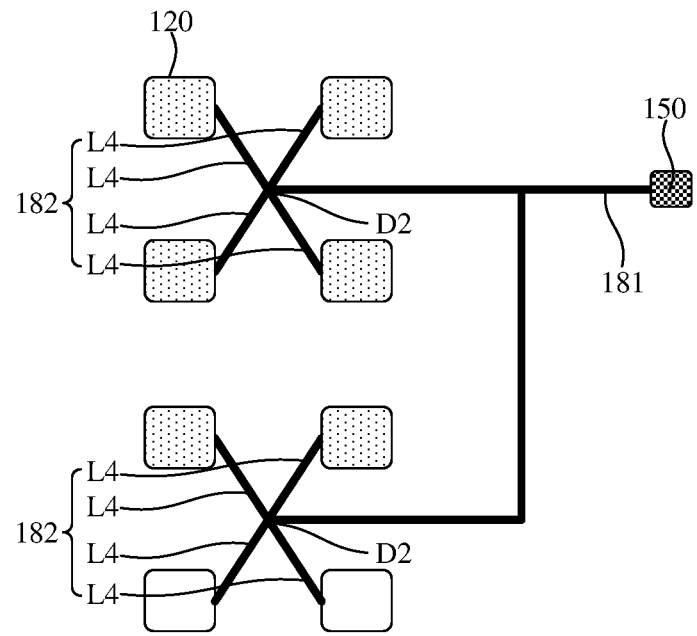
FIG. 14 is a schematic top view of the structure of a second pixel unit of a fourth example in a display panel provided according to an embodiment of the present application in which eight second pixels are divided into two group and two groups are connected to one second pixel circuit.

FIG. 13 and FIG. 14 are respectively a schematic top view of the structure of the second pixel unit of a third example in which four second pixels are divided into one group and are connected to one second pixel circuit and the second pixel unit of a fourth example in which eight second pixels are divided into two group and two groups are connected to one second pixel circuit in a display panel provided according to an embodiment of the present application.

In the present embodiment, the second pixel unit DU2 includes q second pixels 120 of the same color, the q second pixels 120 are divided into at least one group, and each group of second pixels 120 includes at least two second pixels 120, where q is an integer greater than or equal to 2.

In the embodiment shown in FIG. 13, the second pixel unit DU2 includes four second pixels 120 of the same color, and the four second pixels 120 are divided into one group. In the embodiment shown in FIG. 14, the second pixel unit DU2 includes eight second pixels 120 of the same color, and the eight second pixels 120 are divided into two groups, and each group includes four second pixels 120.

The number of the second node D2 of the second lead 181 is the same as the number of group of second pixels 120, and each group of second pixels 120 is connected to one second node D2. The second interconnection structure 182 includes a plurality of second branch lines L4, one end of each of the plurality of second branch lines L4 is connected to one second pixel 120, and the other end is connected to a corresponding second node D2. In the embodiment shown in FIG. 13, each second pixel 120 is connected to the same and one second node D2 through a corresponding second branch line L4. In the embodiment shown in FIG. 14, the number of the second node D2 is two, and each group of second pixels 120 is connected to one second node D2. In each group, the four second pixels 120 are respectively connected to the same and one second node D2 through the corresponding second branch line L4.

In some embodiments, the line lengths of each of the plurality of second branch lines L4 are equal, so that the resistance of each second pixel 120 in the second pixel unit DU2 to the second pixel circuit 150 tends to be equal, thereby further alleviating the problem of uneven display brightness in the second display area AA2.

Embodiments of the present application also provide a display device, which may include the display panel 100 of any one of the foregoing embodiment modes. The display panel 100 may include a first surface and a second surface opposite to each other, wherein the first surface is a display surface. In some embodiments, the display device further includes a photosensitive component located on the second surface side of the display panel 100, and the photosensitive component corresponds to the position of the second display area AA2.

The photosensitive component may be an image acquisition device for acquiring external image information. In the present embodiment, the photosensitive component is a complementary metal oxide semiconductor (CMOS) image acquisition device. In some other embodiments, the photosensitive component may also be other forms of image acquisition devices such as a charge-coupled device (CCD) image acquisition device. It is understandable that the photosensitive component may not be limited to an image acquisition device. For example, in some embodiments, the photosensitive component may also be a light sensor such as an infrared sensor or a proximity sensor.

In the display device according to the embodiment of the present application, the display panel 100 includes a first display area AA1, a second display area AA2, and a transition display area TA. The light transmittance of the second display area AA2 is greater than that of the first display area AA1 and the transition display area TA, which facilitate being configured as the integration area of the photosensitive component to realize the under-screen integration of the photosensitive component. The plurality of second pixel circuits 150 for driving the plurality of second pixels 120 of the second display area AA2 to display is located in the transition display area TA, thereby reducing the wiring structure in the second display area AA2 and improving the light transmittance of the second display area AA2. The plurality of third pixel circuits 160 for driving the plurality of third pixels 130 of the transition display area TA to display is electrically connected to two or more third pixels 130 of the same color, thereby saving the occupied area of the plurality of third pixel circuits 160 in the transition display area TA, so that the layout of the plurality of second pixel circuits 150 and the plurality of third pixel circuits 160 in the transition display area TA is more reasonable to avoid layout conflict.

According to the above-mentioned embodiments of the present application, these embodiments do not describe all the details in detail, nor do they limit the application to only the specific embodiments described. Obviously, according to the above description, many modifications and changes can be made. This specification selects and specifically describes these embodiments in order to better explain the principles and practical applications of this application, so that those skilled in the art can make good use of this application and make modifications on the basis of this application. This application is only limited by the claims and their full scope and equivalents.

What is claimed is:

1. A display panel comprising a first display area, a second display area, and a transition display area located between the first display area and the second display area, wherein the light transmittance of the second display area is greater than the light transmittance of the first display area and the transition display area, the display panel comprises:
    a plurality of first pixels located in the first display area;
    a plurality of second pixels located in the second display area;
    a plurality of third pixels located in the transition display area;
    a plurality of second pixel circuits, wherein the plurality of second pixel circuits are located in the transition display area and are used to drive the plurality of second pixels to display; and
    a plurality of third pixel circuits, wherein the plurality of third pixel circuits are located in the transition display area and are used to drive the plurality of third pixels to display,
    wherein the display panel further comprises a third pixel unit, and the third pixel unit comprises one of the plurality of third pixel circuits and two or more of the plurality of third pixels of the same color electrically connected to the one third pixel circuit.

2. The display panel of claim 1, wherein the two or more third pixels of the same color in the third pixel unit are electrically connected to the one third pixel circuit through a first connection component, wherein the first connection component electrically connects any at least two of the plurality of third pixels to the one third pixel circuit in a manner of equal resistance.

3. The display panel of claim 2, wherein the first connection component electrically connects all of the plurality of third pixels to the one third pixel circuit in a manner of equal resistance.

4. The display panel of claim 2, wherein the first connection component comprises:
    a first lead connected to the one third pixel circuit and comprising at least one first node; and
    a first interconnection structure, which interconnects the two or more third pixels of the same color and is connected to the first node of the first lead.

5. The display panel of claim 4, wherein the first lead and the first interconnection structure are respectively located on different layers in the thickness direction of the display panel, and the first node of the first lead is connected to the first interconnection structure through a first via hole.

6. The display panel of claim 4, wherein each of the plurality of third pixels comprises a first electrode, a light-emitting layer on the first electrode, and a second electrode on the light-emitting layer, and the first interconnection structure interconnects the first electrodes of the two or more third pixels of the same color.

7. The display panel of claim 6, wherein the first interconnection structure and the first electrode are provided in the same layer.

8. The display panel of claim 4, wherein the two or more third pixels of the same color in the third pixel unit are arranged collinearly, the first interconnection structure comprises at least one first interconnection line, and every adjacent ones of the two or more third pixels of the same color are connected by one first interconnecting line;
    the first node of the first lead is connected to a midpoint of the first interconnection line.

9. The display panel of claim 8, wherein the third pixel unit comprises m third pixels of the same color, the first interconnection structure comprises m−1 first interconnection lines and the m−1 first interconnection lines are arranged collinearly, where m is an integer greater than or equal to 2;
    the number of the first node of the first lead is greater than or equal to 1, and the first interconnection line connected to the first node separates uniformly the m third pixels arranged collinearly.

10. The display panel of claim 4, wherein the third pixel unit comprises n third pixels of the same color, and the n third pixels are divided into at least one group, and each group of third pixels comprises at least two third pixels of the n third pixels, where n is an integer greater than or equal to 2;
    the number of the first node of the first lead is the same as the number of the group of third pixels, and each group of third pixels is connected to one first node;
    the first interconnection structure comprises a plurality of first branch lines, one end of each of the plurality of first branch lines is connected to one of the at least two third pixels, and the other end is connected to the corresponding first node; wherein the line lengths of each of the plurality of first branch lines are equal.

11. The display panel of claim 1, wherein the display panel comprises a second pixel unit, and the second pixel unit comprises one of the plurality of second pixel circuits and two or more of the plurality of second pixels of the same color electrically connected to the one second pixel circuit.

12. The display panel of claim 1, wherein the size of each of the plurality of second pixels is greater than or equal to the size of each of the plurality of first pixels, and/or the size of each of the plurality of third pixels is greater than or equal to the size of each of the plurality of first pixels.

13. The display panel of claim 1, wherein the transition display area comprises a first sub-area adjacent to the first display area, a second sub-area adjacent to the second display area, and a third sub-area located between the first sub-area and the second sub-area, wherein the plurality of the third pixel circuits are located in the first sub-area; the plurality of the second pixel circuits are located in the second sub-area.

14. The display panel of claim 11, wherein in the second pixel unit, the two or more second pixels of the same color are electrically connected to the one second pixel circuit through a second connection component, wherein the second connection component electrically connects any at least two of the plurality of second pixels to the one second pixel circuits in a manner of equal resistance.

15. The display panel of claim 14, wherein the second connection component comprises:
a second lead connected to the one second pixel circuit and comprising at least one second node; and
a second interconnection structure which interconnects the two or more second pixels of the same color and is connected to the second node of the second lead.

16. The display panel of claim 15, wherein the second lead and the second interconnection structure are respectively located on different layers in the thickness direction of the display panel, and the second node of the second lead is connected to the second interconnection structure through a second via hole.

17. The display panel of claim 15, wherein the two or more second pixels in the second pixel unit are arranged collinearly, the second interconnection structure comprises at least one second interconnection line, and every adjacent ones of the two or more second pixels are connected by corresponding one second interconnection line; the second node of the second lead is connected to a midpoint of the second interconnection line.

18. The display panel of claim 17, wherein the second pixel unit comprises p second pixels of the same color, the second interconnection structure comprises p−1 second interconnections lines, and the p−1 second interconnection lines are arranged collinearly, where p is an integer greater than or equal to 2; the number of the second node of the second lead is greater than or equal to 1, and the second interconnection line connected to the second node separates uniformly the p second pixels arranged collinearly.

19. The display panel of claim 15, wherein the second pixel unit comprises q second pixels of the same color, the q second pixels are divided into at least one group, and each group of second pixels comprise at least two second pixels of the q second pixels, where q is an integer greater than or equal to 2;
the number of the second node of the second lead is the same as the number of the group of second pixels, and each group of second pixels is connected to corresponding one second node;
the second interconnection structure comprises a plurality of second branch lines, one end of each of the plurality of second branch lines is connected to one of at least two second pixels, and the other end is connected to the corresponding second node; wherein the line lengths of each of the plurality of second branch lines are equal.

20. A display device comprising the display panel according to claim 1.

* * * * *